(12) United States Patent
Chen et al.

(10) Patent No.: US 9,123,604 B2
(45) Date of Patent: Sep. 1, 2015

(54) IMAGE SENSOR WITH DOPED SEMICONDUCTOR REGION FOR REDUCING IMAGE NOISE

(71) Applicant: OmniVision Technologies, Inc., Santa Clara, CA (US)

(72) Inventors: Qingfei Chen, Santa Clara, CA (US); Qingwei Shan, San Jose, CA (US); Yin Qian, Milpitas, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/056,132

(22) Filed: Oct. 17, 2013

(65) Prior Publication Data

US 2015/0108507 A1    Apr. 23, 2015

(51) Int. Cl.
*H01L 31/12* (2006.01)
*H01L 27/12* (2006.01)
*H01L 31/06* (2012.01)
*H01L 27/146* (2006.01)

(52) U.S. Cl.
CPC ...... *H01L 27/14609* (2013.01); *H01L 27/1464* (2013.01); *H01L 27/14621* (2013.01); *H01L 27/14627* (2013.01); *H01L 27/14683* (2013.01); *H01L 31/125* (2013.01)

(58) Field of Classification Search
CPC ......... H01L 31/02; H01L 31/18; H01L 31/11; H01L 31/32; H01L 27/14
USPC ........ 257/84, 14, 77, 291–292, 432, E27.139, 257/E27.13, E27.122, E21.04; 438/73
See application file for complete search history.

(56) References Cited

U.S. PATENT DOCUMENTS

| | | | |
|---|---|---|---|
| 8,017,427 B2 | 9/2011 | Manabe | |
| 8,022,452 B2 | 9/2011 | Wang et al. | |
| 2006/0038203 A1 | 2/2006 | Wang et al. | |
| 2007/0207566 A1* | 9/2007 | Fu et al. | 438/64 |
| 2009/0200587 A1* | 8/2009 | Venezia et al. | 257/292 |
| 2009/0200625 A1* | 8/2009 | Venezia et al. | 257/432 |
| 2010/0140675 A1* | 6/2010 | Rhodes | 257/292 |
| 2011/0133061 A1* | 6/2011 | Yu et al. | 250/214.1 |
| 2011/0260221 A1* | 10/2011 | Mao et al. | 257/291 |
| 2012/0038014 A1* | 2/2012 | Tai et al. | 257/437 |
| 2012/0080765 A1* | 4/2012 | Ku et al. | 257/432 |
| 2013/0200396 A1 | 8/2013 | Zheng et al. | |
| 2013/0207212 A1 | 8/2013 | Mao et al. | |

OTHER PUBLICATIONS

Falk, R. A., "Near IR Absorption in Heavily Doped Silicon—An Empirical Approach," International Symposium for Testing and Failure Analysis, ASM International; 1998, 2000 (7 pages).

* cited by examiner

*Primary Examiner* — Amar Movva
*Assistant Examiner* — Sheikh Maruf
(74) *Attorney, Agent, or Firm* — Blakely Sokoloff Taylor & Zafman LLP (57) ABSTRACT

A backside illuminated image sensor includes a semiconductor layer having a back-side surface and a front-side surface. The semiconductor layer includes a pixel array region including a plurality of photodiodes configured to receive image light through the back-side surface of the semiconductor layer. The semiconductor layer also includes a peripheral circuit region including peripheral circuit elements for operating the plurality of photodiodes that borders the pixel array region. The peripheral circuit elements emit photons. The peripheral circuit region also includes a doped semiconductor region positioned to absorb the photons emitted by the peripheral circuit elements to prevent the plurality of photodiodes from receiving the photons.

11 Claims, 8 Drawing Sheets

IMAGE SENSOR WITH DOPED SEMICONDUCTOR REGION FOR REDUCING IMAGE NOISE

TECHNICAL FIELD

This disclosure relates generally to image sensors, and in particular but not exclusively, relates to electromagnetic noise reduction in image sensors.

BACKGROUND INFORMATION

As image sensor features continue to scale down, photodiodes in pixels of the image sensors and peripheral circuit elements that serve to control those pixels are disposed closer together. The peripheral circuitry can emit electromagnetic radiation that propagates into the photodiodes, especially at the edges of the pixel array. In some cases, the electromagnetic radiation is non-visible light. The photodiodes are meant to measure image charge generated by image light incident on the photodiodes. When the undesirable non-visible light from the peripheral circuit elements also reaches the photodiodes, it adds additional undesired image charge that results in image distortion including unwarranted bright pixels. Hence, an image sensor architecture that reduced or eliminated electromagnetic radiation generated by peripheral circuit elements from influencing the image signal in the photodiodes is desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an image sensor and a method for fabricating an image sensor are described herein. In the following description, numerous specific details are set forth to provide a thorough understanding of the embodiments. One skilled in the relevant art will recognize, however, the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" or "one example" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
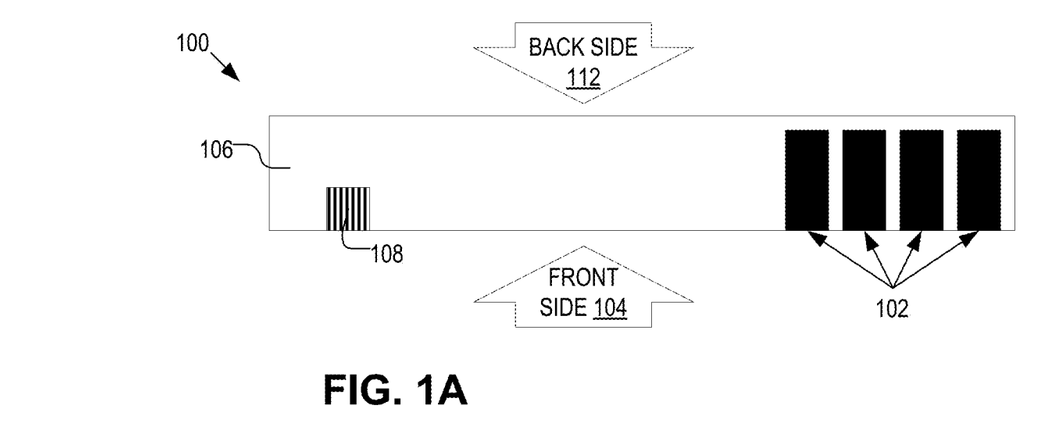
FIG. 1A is a cross section illustration of semiconductor layer including a plurality of photodiodes and peripheral circuit elements, in accordance with an embodiment of the disclosure.

FIG. 1A is a cross section illustration of a semiconductor layer 106 including a plurality of photodiodes 102 and peripheral circuit elements 108, in accordance with an embodiment of the disclosure. Semiconductor layer 106 is part of image sensor structure 100. Semiconductor layer 106 has a front-side surface 104 and a back-side surface 112. In one embodiment, semiconductor layer 106 includes silicon.

Figure 1B:
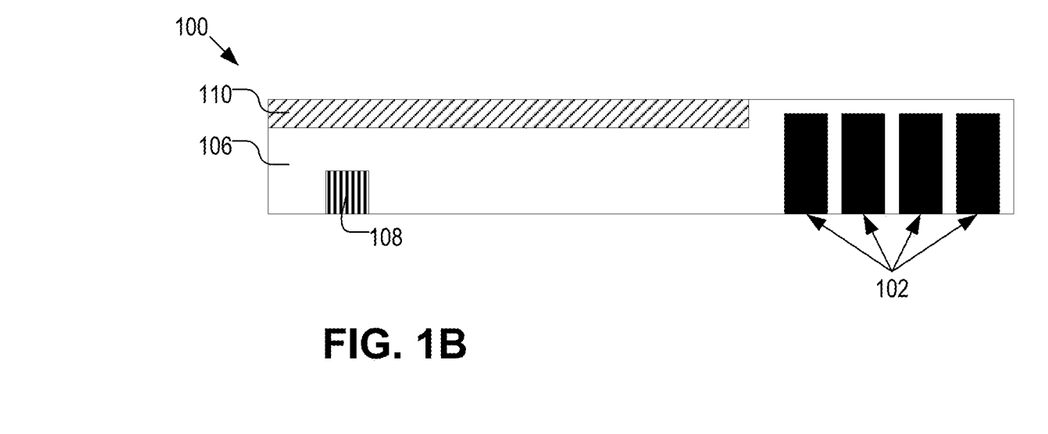
FIG. 1B is a cross section illustration of the semiconductor layer of FIG. 1A that includes a doped semiconductor region disposed along the back-side surface of the semiconductor layer, in accordance with an embodiment of the disclosure.

FIG. 1B is a cross section illustration of the semiconductor layer 106 of FIG. 1A that includes a doped semiconductor region 110 disposed along the back-side surface 112 of semiconductor layer 106, in accordance with an embodiment of the disclosure. In one embodiment, doped semiconductor region 110 is P+ doped with boron. In another embodiment, doped semiconductor region 110 is N− doped with Arsenic, Phosphorus, or Antimony. The concentrations in both P+ and N− doped embodiments may exceed $1 \times 10^{17}$ atoms/cm$^3$. In one embodiment, the P+ ion density is between $1 \times 10^{18}$ atoms/cm$^3$ and $1 \times 10^{19}$ atoms/cm$^3$.

Figure 1C:
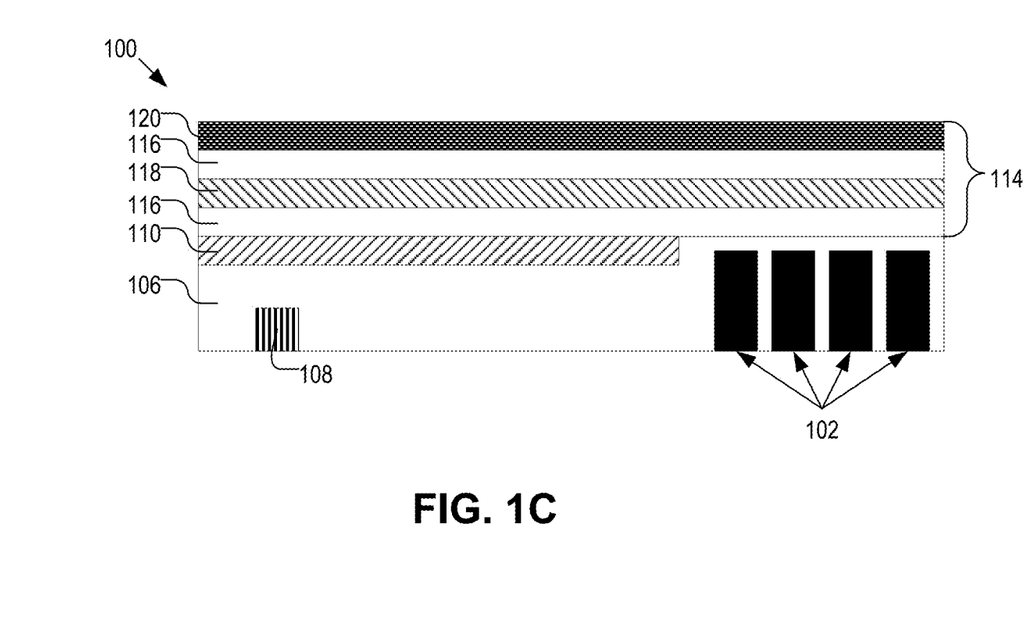
FIG. 1C is a cross section illustration of an image sensor structure that includes intermediate layers disposed over the semiconductor layer of FIG. 1B, in accordance with an embodiment of the disclosure.

FIG. 1C is a cross section illustration of image sensor structure 100 that includes intermediate layers 114 disposed over the semiconductor layer 106 of FIG. 1B, in accordance with an embodiment of the disclosure. In the illustrated embodiment intermediate layers 114 includes a silicon nitride layer 120, a silicon carbide layer 118, and silicon oxide layers 116.

Figure 1D:
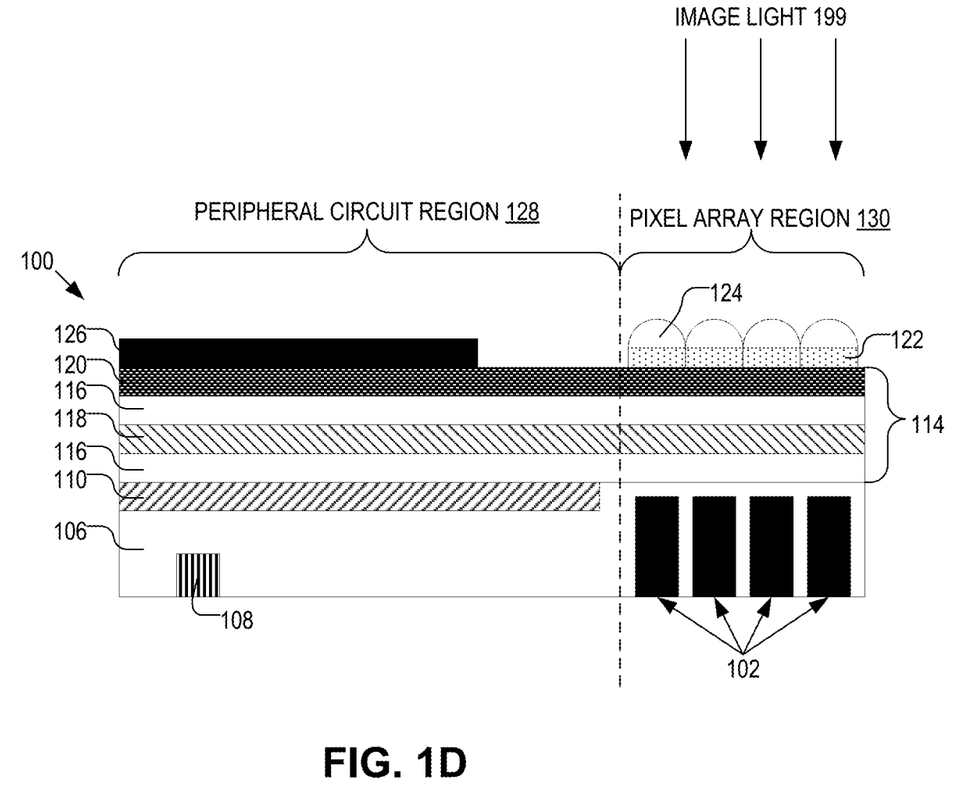
FIG. 1D is a cross section illustration of an image sensor structure that includes a color filter layer and microlenses disposed over the image sensor structure of FIG. 1C, in accordance with an embodiment of the disclosure.

FIG. 1D is a cross section illustration of image sensor structure 100 that includes a color filter layer 122 and microlenses 124 disposed over the image sensor structure 100 of FIG. 1C, in accordance with an embodiment of the disclosure. FIG. 1D also includes an optical shield layer 126 disposed over silicon nitride layer 120. The color filter layer 122 may include red, green, and blue filters (arranged in a Bayer pattern) that pass select wavelengths of light to reach the plurality of photodiodes 102. Microlenses 124 are disposed over the color filter layer 122 and are configured to focus image light onto the plurality of photodiodes 102. Optical shield layer 126 is disposed in peripheral circuit region 128 and prevents image light from reaching the peripheral circuitry elements 108 and interfering with logic functions. The optical shield layer 126 may include metal.

FIG. 1D shows that a pixel array region 130 includes the plurality of photodiodes 102 and the plurality of photodiodes are configured to receive image light 199 through back-side surface 112 of semiconductor layer 106. Peripheral circuit region 128 borders pixel array region 130 and includes peripheral circuit elements 108 for operating the plurality of photodiodes 102.

Figure 2:
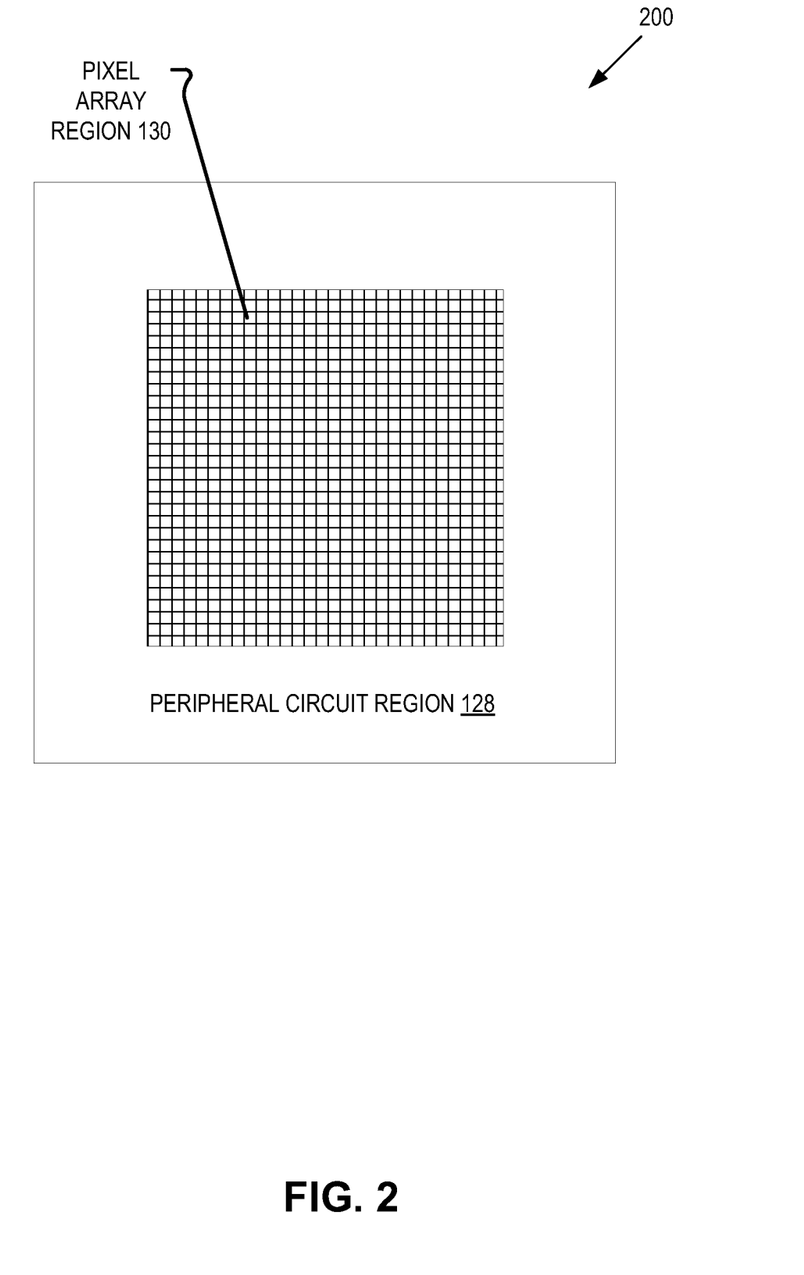
FIG. 2 is a plan view of an example image sensor that includes a pixel array region and a peripheral circuit region, in accordance with an embodiment of the disclosure.

FIG. 2 is a plan view of an example image sensor 200 that includes an example placement of pixel array region 130 and peripheral circuit region 128, in accordance with an embodiment of the disclosure. In the illustrated embodiment, the plurality of photodiodes 102 is arranged in pixel array region 130 surrounded by the peripheral circuit region 128. Optical shield layer 126 may be disposed above all or almost all of peripheral circuit region 128 to block image light 199 from reaching the peripheral circuit elements 108.

Figure 3:
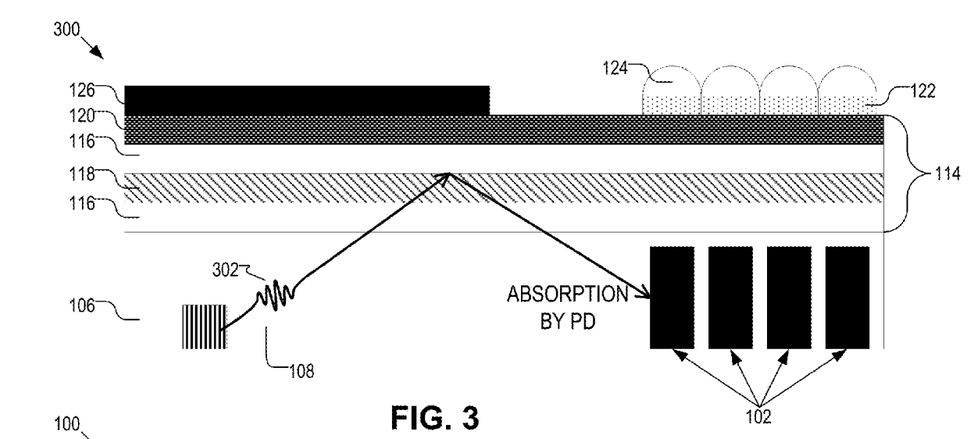
FIG. 3 illustrates a cross section of an image sensor that does not possess a doped semiconductor region for blocking unwanted electromagnetic radiation from peripheral circuit elements.

FIG. 3 illustrates a cross section of an image sensor 300 that does not include a doped semiconductor region 110. In operation, peripheral circuit components 108 may emit electromagnetic radiation 302 that propagates toward intermediate layers 114. Depending on the index of refraction of intermediate layers 114, a portion of the electromagnetic radiation 302 may be reflected back toward photodiodes 102. Photons included in electromagnetic radiation 302 may propagate to photodiodes 102 and be absorbed by photodiodes 102, generating unwanted image charge. The unwanted image charge generated by photons from peripheral circuit elements 108 may introduce noise (which may be fixed pattern noise) into images captured by the plurality of photodiodes 102. The electromagnetic radiation 302 emitted by peripheral circuit elements 108 may be from 900-1400 nm.

Figure 4:
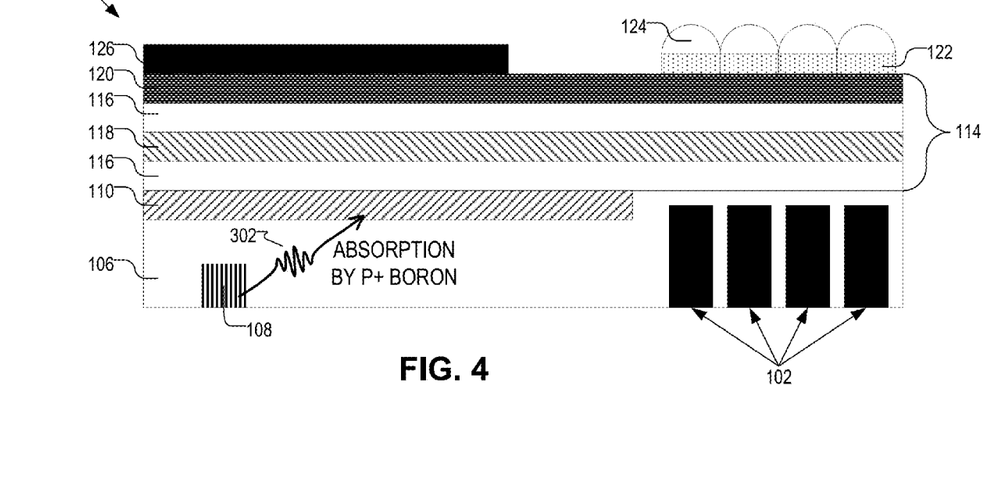
FIG. 4 is a cross section illustration of an image sensor that includes a semiconductor layer with a doped semiconductor region positioned to block or absorb electromagnetic radiation produced by peripheral circuitry, in accordance with an embodiment of the disclosure.

FIG. 4 is a cross section illustration of image sensor 100 that includes semiconductor layer 106 with doped semiconductor region 110 positioned to block or absorb electromagnetic radiation 302 produced by peripheral circuitry 108, in accordance with an embodiment of the disclosure. In operation, peripheral circuit components 108 may emit electromagnetic radiation 302 that propagates toward intermediate layers 114. However, doped semiconductor region 110 absorbs photons in electromagnetic radiation 302 that would generate image charge in photodiodes 102. Therefore, doped semiconductor region 110 blocks the photons from propagating into intermediate layers 114 and then being reflected back towards photodiodes 102 by the intermediate layers 114. As a result, photons emitted by peripheral circuit elements 108 generate less noise in images captured by photodiodes 102. Including doped semiconductor region 110 into image sensor 100 may especially reduce image noise (contributed by peripheral circuit elements 108) around the border of an image captured by photodiodes 102, as the peripheral circuit elements 108 are often positioned close to the outside of a pixel array that includes photodiodes 102.

Figure 5A:
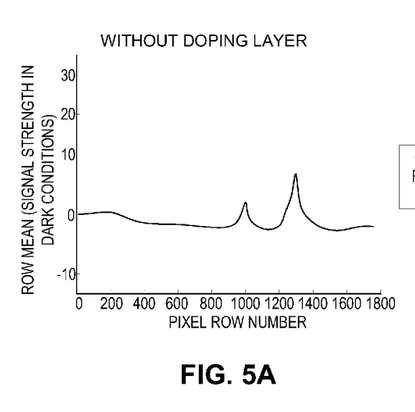
FIGS. 5A and 5B are graphs of electromagnetic signal strength in a dark condition detected by photodiodes of image sensors with and without a doped semiconductor region, in accordance with an embodiment of the disclosure.
Figure 5B:
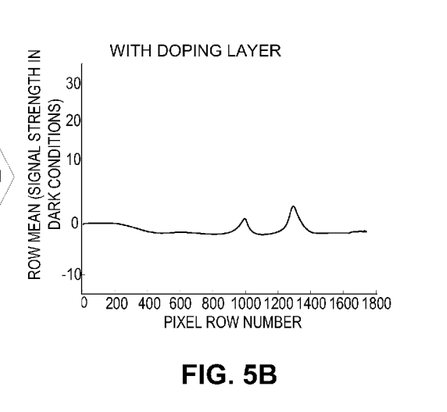

FIGS. 5A and 5B are graphs of electromagnetic signal strength in a dark condition detected by photodiodes of pixels in image sensors with and without a doped semiconductor region, in accordance with an embodiment of the disclosure. FIG. 5A is a graph of electromagnetic signal strength (Y-axis) detected by pixels in an image sensor without a doped semiconductor region 110 (e.g. image sensor 300) in dark conditions vs. the row number of pixels (X-axis) in the image sensor. In other words, the Y-axis shows the relative amount of electromagnetic radiation received by the photodiodes from the peripheral circuit region, when ambient light is not shining on the pixels (that include photodiodes 102) of the image sensor. The X-axis shows the pixel row number of the pixels receiving the electromagnetic radiation. In FIG. 5A dark signal strength was measured in an image sensor (e.g. image sensor 300) without a doped semiconductor region. FIG. 5A shows that large peaks are present near pixel row number 1000 and 1300, indicating these two rows are receiving a sizable amount of electromagnetic radiation from peripheral circuit elements 108.

FIG. 5B shows the same graph parameters as in FIG. 5A, however, the image sensor (e.g. image sensor 100) that measured the dark condition in FIG. 5B included a doped semiconductor region 110. Applicants observed that including doped semiconductor region 110 into an image sensor decreased noise from the peripheral circuit region, when measured in a dark environment. This noise reduction is shown in the decrease in peak heights seen in FIG. 5B, as compared with FIG. 5A. Noise reduction of approximately 40% was observed in tests that included a 0.5 second exposure of the pixels.

Figure 6:
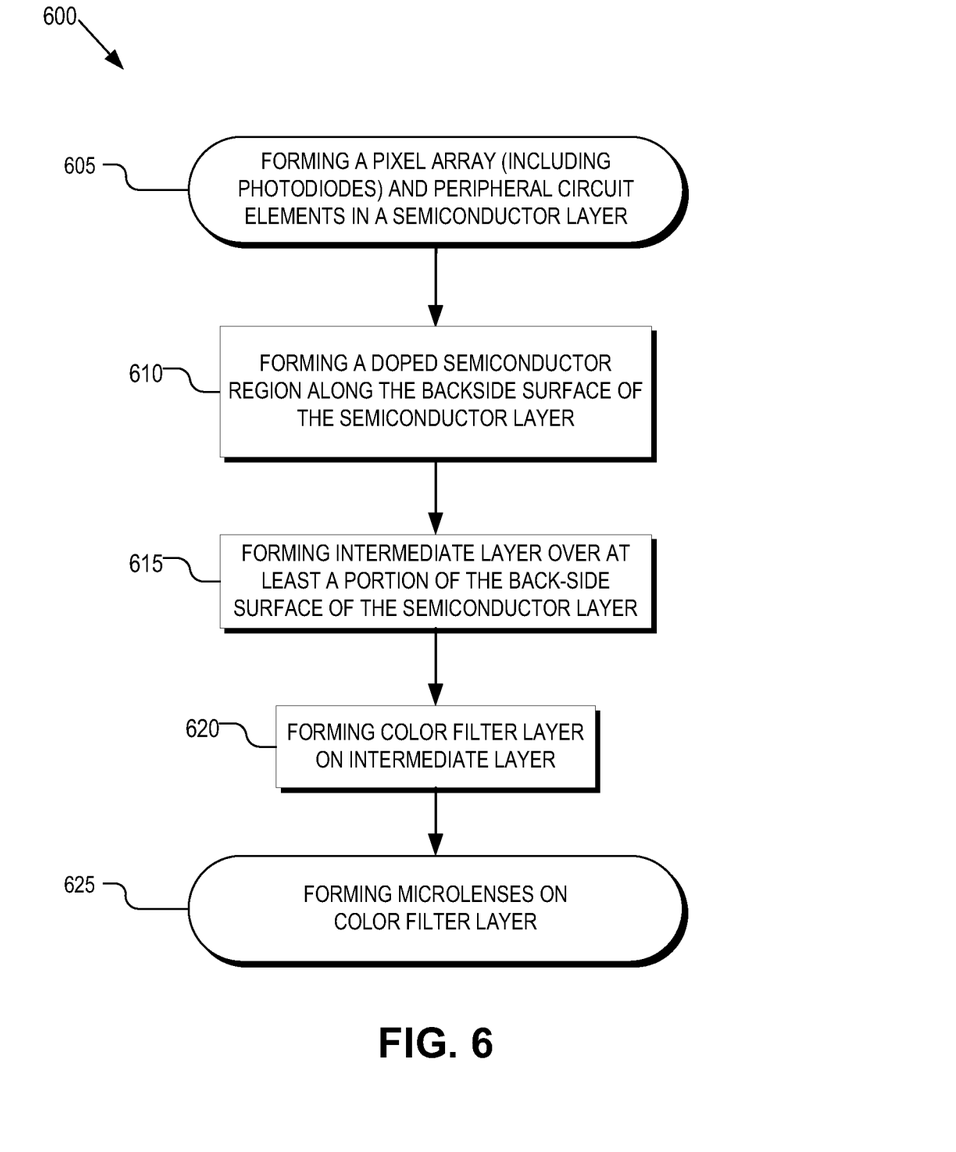
FIG. 6 is a flow chart illustrating one possible method of fabricating an image sensor that includes a doped semiconductor region, in accordance with an embodiment of the disclosure.

FIG. 6 is a flow chart illustrating one possible method of fabricating an image sensor that includes a doped semiconductor region, in accordance with an embodiment of the disclosure. It should be noted that the order in which some or all of the process blocks appear in process 600 should not be deemed limiting. Rather, one of ordinary skill in the art having the benefit of the present disclosure will understand that some of the process blocks may be executed in a variety of orders not illustrated, or even in parallel.

In process block 605, a pixel array including photodiodes (e.g. photodiodes 102) and peripheral circuit elements (e.g. 108) are formed in a semiconductor layer (e.g. semiconductor layer 106). In process block 610, a doped semiconductor region (e.g. doped semiconductor layer 110) is formed in the semiconductor layer. Forming the doped semiconductor region may include implanting a dopant (N− or P+) in the semiconductor layer using ion implantation. The doped semiconductor region is disposed along the backside surface of the semiconductor layer. One or more intermediate layers (e.g. intermediate layer(s) 114) are formed over at least a portion of the semiconductor layer, in process block 615. In one embodiment, the intermediate layers are formed over the pixel array region, but not over the peripheral circuit region. The intermediate layers may be grown or deposited onto the semiconductor layer. In process block 620, a color filter layer is formed on the intermediate layer(s). In one embodiment, the color filter layer may include red, green, and blue color filters arranged in a Bayer pattern. In process block 625 microlenses are formed on the color filter layer.

Figure 7:
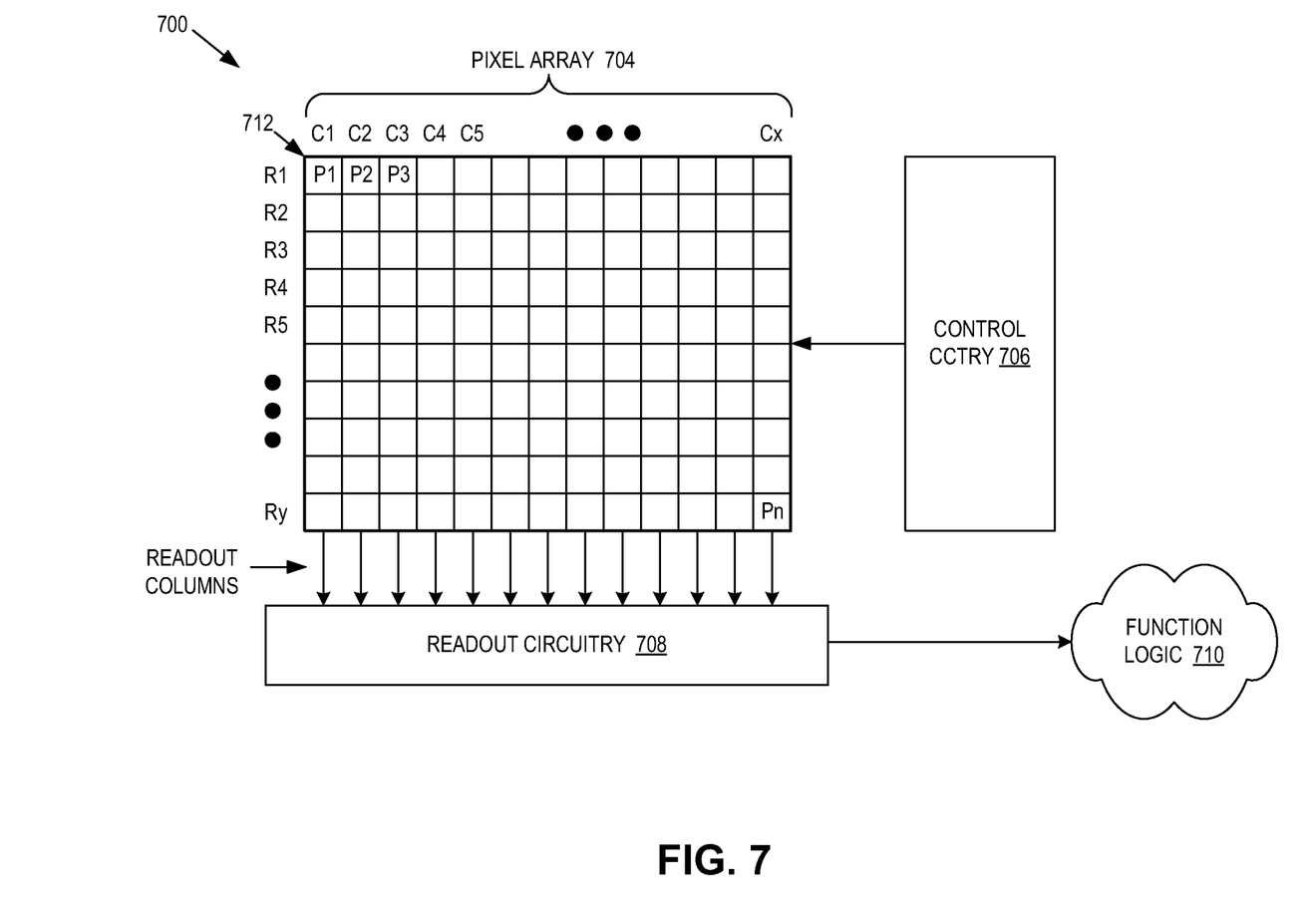
FIG. 7 is a block diagram schematic of an image sensor system that includes a pixel array, control circuitry, readout circuitry, and function logic, in accordance with an embodiment of the disclosure.

FIG. 7 is a block diagram schematic of an image sensor system 700, in accordance with an embodiment of the disclosure. FIG. 7 includes a pixel array 704 (including individual pixels 712 that would include photodiodes 102), control circuitry 706 coupled to pixel array 704 to control operation of the pixel array 704, readout circuitry 708 coupled to the pixel array 704 to readout image data from the pixel array 704, and function logic 710 coupled to the readout circuitry 708 to store the image data readout from the pixel array 704.

In one embodiment, pixel array 704 is a two-dimensional array of photodiodes or pixels (e.g., pixels P1, P2, P3 . . . , Pn). As illustrated, each pixel 712 can be arranged into a row (e.g., rows R1, R2, R3 . . . , Ry) and column (e.g., column C1, C2, C3 . . . , Cx) to acquire image data of an object, which can then be used to render an image of said object.

In one embodiment, after each pixel 712 receives image charge from image light, image data from the pixels is read out by readout circuitry 708 and then transferred to function logic 710. In various embodiments, readout circuitry 708 may include amplification circuitry, analog-to-digital ("ADC") conversion circuitry, or otherwise. In one embodiment, readout circuitry 708 may read out one row of image data at a time along readout column lines (illustrated) or may read out the image data using a variety of other techniques (not illustrated), such as a serial read out or a full parallel read out of all pixels simultaneously. Function logic 710 may simply store the image data or even manipulate the image data by applying post image effects (e.g., crop, rotate, adjust brightness, adjust contrast, or otherwise).

In one embodiment, control circuitry 706 is coupled to pixel array 704 to control operational characteristics of pixel array 704. For example, control circuitry 706 may generate a shutter signal for controlling image acquisition. In one embodiment, the shutter signal is a global shutter signal for simultaneously enabling all pixels 712 within pixel array 704 to simultaneously capture their respective image data during a single acquisition window. In another embodiment, the shutter signal is a rolling shutter signal such that each row, column, or group of pixels 712 is sequentially enabled during consecutive acquisition windows.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated image sensor comprising:
   a semiconductor layer having a back-side surface and a front-side surface, wherein the semiconductor layer includes silicon, and wherein the semiconductor layer comprises:
      a pixel array region including a plurality of photodiodes configured to receive image light through the back-side surface of the semiconductor layer; and
      a peripheral circuit region including peripheral circuit elements for operating the plurality of photodiodes, wherein the peripheral circuit elements emit photons in a non-visible wavelength, and wherein the peripheral circuit region borders the pixel array region, the peripheral circuit region further including a doped semiconductor region doped to a level to absorb the photons emitted by the peripheral circuit elements to prevent the plurality of photodiodes from receiving the photons, wherein the doped semiconductor region is disposed along the back-side surface of the semiconductor layer above the peripheral circuit elements with no part of the doped semiconductor region above the pixel array region.

2. The backside illuminated image sensor of claim 1 further comprising at least one intermediate layer disposed above at least the peripheral circuit region of the semiconductor layer.

3. The backside illuminated image sensor of claim 1, wherein the doped semiconductor region is configured to absorb near-infrared ("NIR") light emitted by the peripheral circuit region.

4. The backside illuminated image sensor of claim 1, wherein the doped semiconductor region is doped with a P+ dopant.

5. The backside illuminated image sensor of claim 4, wherein the doped semiconductor region comprises doped silicon with a boron concentration of greater than $1 \times 10^{17}$ atoms/cm$^3$.

6. The backside illuminated image sensor of claim 1, wherein the doped semiconductor region is doped with an N− dopant.

7. The backside illuminated image sensor of claim 6, wherein the doped semiconductor region comprises doped silicon with a concentration of greater than $1 \times 10^{17}$ atoms/cm$^3$ of at least one of Arsenic, Phosphorus, or Antimony.

8. The backside illuminated image sensor of claim 1, wherein the plurality of photodiodes is arranged as a pixel array having rows and columns.

9. The backside illuminated image sensor of claim 1 further comprising at least one intermediate layer disposed above at least the peripheral circuit region of the semiconductor layer, wherein the at least one intermediate layer includes at least one of silicon oxide, silicon carbide, or silicon nitride.

10. The backside illuminated image sensor of claim 9 further comprising a color filter layer, wherein the at least one intermediate layer is disposed between the semiconductor layer and the color filter layer.

11. The backside illuminated image sensor of claim 10 further comprising:
    microlenses for focusing the image light onto the plurality of photodiodes, wherein the color filter layer is disposed between the semiconductor layer and the microlenses.

* * * * *